June 25, 1957 M. C. KIDD 2,797,327

SEMI-CONDUCTOR SAWTOOTH WAVE GENERATOR

Filed Nov. 17, 1954

INVENTOR.
Marshall C. Kidd
BY
[signature]
ATTORNEY

United States Patent Office 2,797,327

Patented June 25, 1957

2,797,327

SEMI-CONDUCTOR SAWTOOTH WAVE GENERATOR

Marshall C. Kidd, Haddon Heights, N. J., assignor to Radio Corporation of America, a corporation of Delaware Application November 17, 1954, Serial No. 469,457

5 Claims. (Cl. 250—36)

This invention relates to signal or voltage generators of the type having semi-conductor devices such as transistors as generating elements, and in particular to sawtooth voltage generators of that type.

A generated sawtooth signal or voltage wave, in general, increases at substantially a constant rate for a certain time interval, followed by a rapid drop in value of the voltage. To provide such a voltage wave many circuit arrangements employing both electron tubes and transistors have been devised. Such circuits may be useful for many different circuit applications such as, for example, in the deflection circuits of television cameras and receivers or in oscilloscopes.

There are, in general, two types of deflection, namely electrostatic and electromagnetic. In electrostatic deflection the electron stream from the cathode of a cathode ray tube is deflected by the electrostatic field between the deflection plates of the cathode ray tube. Generally, a sawtooth wave is applied to the horizontal deflection plates to supply the correct time base. For some applications, one of the horizontal deflection plates is driven positive by a signal and the other deflection plate is driven negative by the same signal but 180° out-of-phase with the first. Thus, the average potential of the pair of deflection plates is substantially constant. This type of sweep is designated as push-pull deflection and its particular advantage is that it substantially eliminates the defocusing effect of unbalanced deflection. Many electron tube circuits requiring the use of two or more tubes and relatively complicated circuitry are used to provide a push-pull sawtooth wave for push-pull deflection applications.

It is, accordingly, an object of the present invention to provide an improved sawtooth wave generator employing semi-conductor devices such as transistors which may provide uniform push-pull sawtooth wave voltages.

It is another object of the present invention to provide a balanced push-pull sawtooth voltage generator which may utilize effectively a single transistor for efficient and simplified circuit operation.

It is still another object of the present invention to provide a push-pull sawtooth wave generator which may utilize effectively a single junction transistor as an active signal translating element thereof and which may be suitable for use in a balanced deflection circuit.

These and further objects and advantages of the present invention are achieved, in general, by biasing a semi-conductor device which may be, for example, a junction transistor, in such a manner that a negative resistance characteristic is obtained. The type of operation thus obtainable is referred to as "delayed collector conductivity" operation. The transistor is connected for common emitter operation and has a capacitor connected directly between its collector and emitter. A first resistor is serially connected between the collector and the bias supply while a second resistor is connected between the emitter and ground. For balanced push-pull operation the resistance of these resistors will be equal in magnitude. The negative resistance characteristic of the transistor is utilized to affect the discharge of the capacitor through the collector-to-emitter conductive path of the transistor to provide balanced push-pull sawtooth voltage waves.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
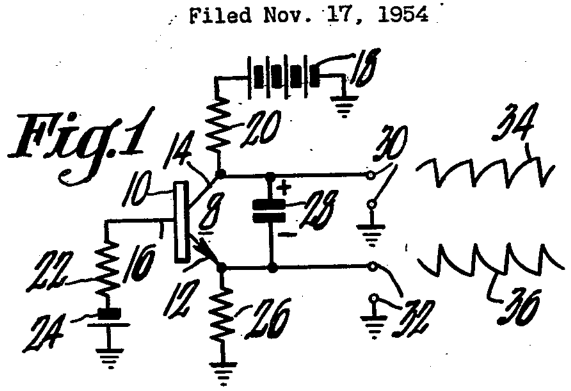
Figure 1 is a schematic circuit diagram of a push-pull sawtooth wave generator in accordance with the invention.

Referring now to the drawing, wherein like parts are indicated by like reference numerals throughout the figures, and referring particularly to Figure 1, a semi-conductor device or transistor 8 includes a semi-conductive body 10 with which three electrodes are cooperatively associated in a well known manner. These are designated, as is conventional, as an emitter 12, a collector 14 and a base 16. In the present example, the transistor 8 may be considered to be of the N–P–N junction type. It should be understood, however, that the invention is not necessarily restricted to junction transistors or transistors of any specific conductivity type, and other transistors having characteristics similar to the characteristics of junction transistors and which will be described herein can be used.

To obtain the desired negative resistance characteristic for providing push-pull sawtooth wave generation in accordance with the invention, the bias voltage which is applied between the emitter 12 and the base 16 of the transistor 8 is in the reverse or relatively non-conducting direction. The polarity of this bias voltage will, accordingly, be understood to be opposite to the polarity for normal or conventional junction transistor operation. Accordingly, the base 16 is connected through a resistor 22 to the negative terminal of a source of direct current potential such as illustrated by a battery 24, the positive terminal of which is grounded. Alternatively, the base 16 could be connected directly to ground or to ground through the resistor 22. In either of these cases, the polarity of the bias voltage between the base and emitter electrodes will be understood to be initially in the reverse or non-conducting direction due to the flow of emitter current through the emitter resistor 26.

The collector 14 of the transistor 8 is connected through a resistor 20 to the positive terminal of the collector biasing battery 18, the negative terminal of which is grounded. The collector 14 is thereby biased in the reverse or relatively non-conducting direction with respect to the base 16. The polarity of this bias voltage will, accordingly, be understood to be the same as the polarity for normal or conventional transistor operation. The emitter 12 of the transistor 8 is connected through a resistor 26 to ground. The resistance of the resistor 26, for balanced push-pull operation, will be selected to be of a magnitude equal to the magnitude of the resistance of the collector resistor 20.

Generation of the desired sawtooth wave is effected by the charge and discharge of a capacitor. Accordingly, a capacitor 28 is connected between the collector 14 and the emitter 12 of the transistor 8. The output sawtooth waves are obtainable from two pairs of output terminals 30 and 32. One of the terminals 30 is grounded as shown, while the other is connected directly with the collector 14 of the transistor 8. Similarly, one of the terminals 32 is grounded and the other terminal 32 is connected directly with the emitter 12 of the transistor 8.

In operation, by initially biasing the transistor 8 so that a reverse bias voltage exists between the emitter 12 and the base 16, the emitter is essentially at cutoff. Eventually, due to the flow of the current $I_{co}$ out of the base 16 and through the resistor 22, the effective reverse bias between the emitter 12 and the base 16 will be decreased. In other words, the increase in the drop in potential across the resistor 22 and the resistance of the base electrode, due to the flow of the current $I_{co}$, is in such a direction as to make the base 16 less negative. The current $I_{co}$ is the collector current which flows when the emitter current is zero. Eventually, a point will be reached at which the net voltage between the emitter 12 and the base 16 of the transistor 8 is zero. At substantially the moment that this net voltage is zero, the collector 13 becomes conductive in the same manner as for normal transistor action. By increasing the collector supply voltage, more collector current will flow and the collector-to-emitter voltage will remain substantially constant. The net bias voltage between the emitter 12 and the base 16 will now be slightly negative or in the forward or conducting direction. This mode of operation is referred to as delayed collector conductivity.

By operating a transistor as described (i. e., in the so-called delayed collector conductivity mode), it has been found that the emitter current is smaller than the collector current. In other words, the direct current gain as defined by the ratio of collector current to emitter current is greater than unity. Moreover, the signal current gain as defined by the ratio of collector current increments to base current increments is relatively large, especially when compared with normal transistor action. This gain will increase as the collector voltage is increased. Another advantage afforded by this type of operation is that the output resistance of the transistor is relatively low.

In addition to the above noted characteristics, it has also been found that the delayed collector conductivity mode of operation may provide a negative resistance collector characteristic. This is accomplished, in general, by increasing the collector voltage and is shown by the curve in Figure 2. This negative resistance characteristic is used, in accordance with the invention, to generate the desired sawtooth voltage.

Thus, if it is assumed that the capacitor 28 is initially uncharged, since the transistor 8 is cutoff, it will be charged through the resistors 20 and 26 with a polarity as shown. Eventually the charge on the capacitor 28 and consequently the polarity of the voltage on the collector will attain a positive value of sufficient magnitude that the N–P–N junction transistor 8 is operative as a negative resistance device as shown by the curve in Figure 2. The transistor 8 is in an unstable high current condition at this point. The capacitor 28 then discharges through the collector-to-emitter conductive path of the transistor, providing a push-pull sawtooth wave as shown by the output voltages 34 and 36. The transistor circuit then returns to its initial stable state of low current conduction and the cycle repeats, producing a series of push-pull sawtooth voltage waves as shown.

If the resistance of the resistors 20 and 26 are of equal magnitude, the output voltages 34 and 36 will be equal and out-of-phase. For an N–P–N transistor the sawtooth voltage 34 from the collector will be positive with respect to signal ground, while the sawtooth voltage 36 from the emitter will be negative with respect to signal ground. For a transistor of an opposite conductivity type (i. e., a P–N–P junction transistor), the polarity of the output sawtooth waves 34 and 36 would be reversed. If balanced sawtooth voltage waves are not desired for any reason, the values of the resistors 20 and 26 may be changed to provide sawtooth waves of any desired amplitude.

While it will be understood that the circuit specifications may vary according to the design for any particular application, the following circuit specifications are included for the circuit of Figure 1 by way of example only. One difference is that as noted above the base 16 is returned to ground through the resistor 22 rather than the negative terminal of a battery.

| | |
|---|---|
| Resistors 20 and 26 | 10,000 ohms each. |
| Resistor 22 | 100,000 ohms. |
| Capacitor 28 | 6800 micromicrofarads. |
| Battery 18 | 86 volts. |

As described, therefore, it is seen that the invention is ideally suited to provide the proper sweep voltages in a deflection system. Thus, referring to Figure 3, a P–N–P junction transistor 38 is connected in much the same manner as the N–P–N transistor 8 in Figure 1 to provide the balanced sawtooth sweep voltages for the horizontal deflecting plates 78 and 80 of a cathode ray tube. The P–N–P junction transistor 38 comprises a semi-conductive body 40 with which an emitter 42, a collector 44 and a base 46 are cooperatively associated.

A synchronizing signal may be applied to the base 46 of the transistor 38 from a pair of input terminals 60, one of which is grounded and the other of which is connected through a potentiometer, comprising a resistor 46 and a variable tap 58, and a resistor 54 to the base 46. By varying the position of the tap 58, the amplitude of the synchronizing signal may be varied. The base 46 of the transistor 38 is also connected through a resistor 48 and a second potentiometer, comprising the resistor 50 and the variable tap 52, to the positive terminal of the biasing battery 24, the negative terminal of which, in this case, is grounded. Fine frequency control of the output waves is obtainable by varying the position of the tap 52.

The collector 44 of the transistor 38 is connected through a coupling capacitor 70 to one of the horizontal deflecting plates 78. A resistor 72 is connected from the junction of the capacitor 70 and the deflecting plate 78 to ground as shown. The emitter 42 of the transistor 38 is connected through a coupling capacitor 74 to the other horizontal deflecting plate 80. A resistor 76 is connected from the junction of the capacitor 74 and the deflecting plate 80 to ground.

To provide coarse frequency control, three capacitors 62, 64 and 66 of varying capacitive values are provided, along with a switch 68 which is operative to connect any one of the three capacitors across the discharge capacitor 28. The signal to be observed is connected from a signal amplifier 86 to a pair of vertical deflecting plates 82 and 84. The vertical deflecting plates may be considered to deflect the electron beam of the cathode ray tube up and down, while the balanced sawtooth waves applied to the horizontal plates 78 and 80, in accordance with the invention, will move the electron beam horizontally across the face of the cathode ray tube.

Figures 2, 3:
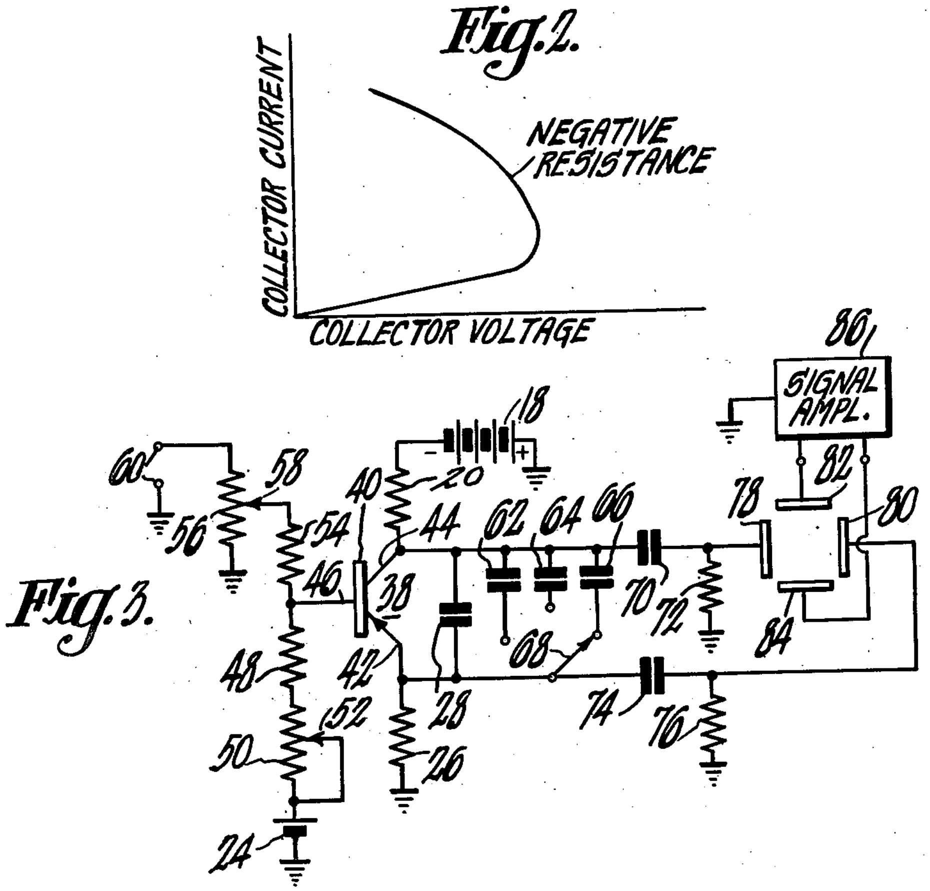
Figure 2 is a graph showing a curve relating collector current to collector voltage for a transistor of the type used in Figure 1.
Figure 3 is a schematic circuit diagram of a portion of the deflection circuit of a cathode ray tube and embodying a sawtooth wave generator of the type illustrated in Figure 1, in accordance with the invention.

In operation, the sawtooth wave generator in Figure 3 is substantially identical to the one illustrated in Figure 1 and operates by virtue of the negative resistance which is developed to cyclically discharge the capacitor 28 through the collector-to-emitter path of the transistor 38. One difference is that since a P–N–P transistor is used, the sawtooth wave applied to the horizontal deflecting plate 78 will be negative, while the sawtooth wave applied to the other horizontal deflecting plate 80 will be positive. These sawtooth waves will be equal in amplitude (assuming the resistors 20 and 26 are equal) and out-of-phase. Thus, a push-pull sawtooth wave generator is provided, in accordance with the invention, which utilizes but one transistor. Accordingly, circuit simplicity characterizes the invention and stable and efficient circuit operation is easily achieved. Thus, the invention will be especially useful wherever a push-pull sawtooth wave is required, such as in deflection circuits.

What is claimed is:

1. A sawtooth wave generator comprising, in combination, a junction transistor including a base, an emitter and a collector electrode, a storage capacitor connected between said collector and emitter electrodes, a first resistor connected with said collector electrode, a second resistor connected between said emitter electrode and a point of reference potential, biasing means for said transistor including a first source of potential serially connected with said first resistor and poled to apply a voltage to said collector electrode whereby said collector electrode is biased in the reverse direction with respect to said base electrode, and a second source of potential serially connected with said base electrode and poled to apply a voltage thereto whereby said emitter electrode is initially biased in the reverse direction with respect to said base electrode to provide a negative resistance characteristic over a portion of the operating range of said transistor whereby said storage capacitor is discharged when it has previously been charged, and output circuit means connected with said collector and emitter electrodes for deriving a push-pull sawtooth output wave from said sawtooth wave generator.

2. A sawtooth wave generator comprising, in combination, a junction transistor including a base, an emitter and a collector electrode, a first biasing means providing collector biasing voltages for said transistor wherein said collector electrode is biased in the reverse direction with respect to said base electrode, a second biasing means effectively connected between said emitter and base electrodes for initially providing a biasing potential in the reverse direction between said emitter and base electrodes to provide a negative resistance characteristic over a portion of the operating range of said transistor, a capacitor connected between said collector and emitter electrodes, a first resistor serially connected between said first biasing means and said collector electrode, a second resistor connected with said emitter electrode, and output circuit means connected with said collector and emitter electrodes for deriving therefrom and across said first and second resistors a push-pull sawtooth output wave.

3. A sawtooth wave generator as defined in claim 2, wherein a third resistor is serially connected between said base electrode and a point of reference potential.

4. A sawtooth wave generator comprising, in combination, a transistor including a base, an emitter and a collector electrode, a storage capacitor connected between said collector and emitter electrodes, means providing biasing voltages for said transistor, said means including a first impedance element and a first source of direct current potential connected in series with said collector electrode for biasing said collector electrode in the reverse direction with respect to said base electrode, a second impedance element and a second source of direct current potential connected in series between said base and emitter electrodes for biasing said emitter electrode in a reverse direction with respect to said base electrode to provide a negative resistance characteristic over a portion of the operating range of said transistor for discharging said storage capacitor through the collector and emitter circuit of said transistor when it has previously been charged, and output circuit means connected with said collector and emitter electrodes for deriving a push-pull sawtooth output wave from said sawtooth wave generator.

5. A sawtooth wave generator comprising, in combination, a junction transistor including a base, an emitter and a collector electrode, a storage capacitor connected between said collector and emitter electrodes, a first resistor connected with said collector electrode, a second resistor connected between said emitter electrode and a point of reference potential, biasing means for said transistor including a first source of potential serially connected with said first resistor and poled to apply a voltage to said collector electrode whereby said collector electrode is biased in the reverse direction with respect to said base electrode and a third resistor and a second source of potential serially connected with said base electrode and poled to apply a voltage thereto whereby said emitter electrode is initially biased in the reverse direction with respect to said base electrode to provide a negative resistance characteristic over a portion of the operating range of said transistor for discharging said storage capacitor after it has previously been charged, and output circuit means connected with said collector and emitter electrodes for deriving a push-pull sawtooth output wave across said first and second resistors.

References Cited in the file of this patent

UNITED STATES PATENTS

| | | |
|---|---|---|
| 2,663,800 | Herzog | Dec. 22, 1953 |
| 2,694,160 | Rea | Nov. 9, 1954 |

OTHER REFERENCES

Article: "A Study of Transistor Circuits for Television," by Sziklai et al.; PIRE for June 1953, pages 708–714.